US010825935B2

(12) United States Patent
Sasaki et al.

(10) Patent No.: US 10,825,935 B2
(45) Date of Patent: Nov. 3, 2020

(54) TRENCH MOS-TYPE SCHOTTKY DIODE

(71) Applicants: TAMURA CORPORATION, Tokyo (JP); National Institute of Information and Communications Technology, Tokyo (JP)

(72) Inventors: Kohei Sasaki, Tokyo (JP); Masataka Higashiwaki, Tokyo (JP)

(73) Assignees: TAMURA CORPORATION, Tokyo (JP); National Institute of Information and Communications Technology, Tokyo (JP)

( * ) Notice: Subject to any disclaimer, the term of this patent is extended or adjusted under 35 U.S.C. 154(b) by 0 days.

(21) Appl. No.: 16/096,717

(22) PCT Filed: Apr. 20, 2017

(86) PCT No.: PCT/JP2017/015825
§ 371 (c)(1),
(2) Date: Oct. 26, 2018

(87) PCT Pub. No.: WO2017/188105
PCT Pub. Date: Nov. 2, 2017

(65) Prior Publication Data
US 2019/0148563 A1 May 16, 2019

(30) Foreign Application Priority Data
Apr. 28, 2016 (JP) .................. 2016-091276

(51) Int. Cl.
*H01L 29/872* (2006.01)
*H01L 29/47* (2006.01)
(Continued)

(52) U.S. Cl.
CPC .......... *H01L 29/8725* (2013.01); *H01L 29/24* (2013.01); *H01L 29/36* (2013.01);
(Continued)

(58) Field of Classification Search
CPC ..... H01L 29/8725; H01L 29/24; H01L 29/36; H01L 29/47; H01L 29/861; H01L 29/868; H01L 29/872
See application file for complete search history.

(56) References Cited

U.S. PATENT DOCUMENTS 7,936,009 B2   5/2011   Pan et al.
8,329,538 B2  12/2012   Pan et al.
(Continued)

FOREIGN PATENT DOCUMENTS

EP    2 779 242 A1    9/2014
JP    2013-102081 A   5/2013
(Continued)

OTHER PUBLICATIONS

International Search Report dated Jul. 11, 2017 issued in PCT/JP2017/015825.
(Continued)

*Primary Examiner* — Sue A Purvis
*Assistant Examiner* — Scott Stowe
(74) *Attorney, Agent, or Firm* — Scully, Scott, Murphy & Presser, P.C.

(57) ABSTRACT

A trench MOS-type Schottky diode includes a first semiconductor layer including a $Ga_2O_3$-based single crystal, a second semiconductor layer that is a layer laminated on the first semiconductor layer and that includes a $Ga_2O_3$-based single crystal and a trench opened on a surface thereof opposite to the first semiconductor layer, an anode electrode formed on the surface of the second semiconductor layer opposite to the first semiconductor layer, a cathode electrode formed on a surface of the first semiconductor layer opposite to the second semiconductor layer, an insulating film covering the inner surface of the trench of the second semiconductor layer, and a trench MOS gate that is embedded in the
(Continued)

trench of the second semiconductor layer so as to be covered with the insulating film and is in contact with the anode electrode.

10 Claims, 18 Drawing Sheets

(51) Int. Cl.
    *H01L 29/868*    (2006.01)
    *H01L 29/861*    (2006.01)
    *H01L 29/24*     (2006.01)
    *H01L 29/36*     (2006.01)

(52) U.S. Cl.
    CPC ............ *H01L 29/47* (2013.01); *H01L 29/861* (2013.01); *H01L 29/868* (2013.01); *H01L 29/872* (2013.01)

(56) References Cited

U.S. PATENT DOCUMENTS

| | | | |
|---|---|---|---|
| 9,171,967 B2 | 10/2015 | Takizawa et al. | |
| 9,412,882 B2 | 8/2016 | Takizawa et al. | |
| 9,595,586 B2 | 3/2017 | Takizawa et al. | |
| 10,230,007 B2 | 3/2019 | Sasaki et al. | |
| 10,439,028 B2 | 10/2019 | Hitora et al. | |
| 10,600,874 B2 | 3/2020 | Takizawa et al. | |
| 2010/0006928 A1 | 1/2010 | Pan et al. | |
| 2011/0244641 A1 | 10/2011 | Pan et al. | |
| 2014/0217405 A1* | 8/2014 | Sasaki ................ | H01L 29/7813 257/43 |
| 2014/0217469 A1 | 8/2014 | Sasaki et al. | |
| 2014/0332823 A1 | 11/2014 | Takizawa et al. | |
| 2016/0043238 A1 | 2/2016 | Takizawa et al. | |
| 2016/0322467 A1 | 11/2016 | Takizawa et al. | |
| 2017/0162655 A1 | 6/2017 | Takizawa et al. | |
| 2017/0200790 A1 | 7/2017 | Hitora et al. | |
| 2017/0213918 A1 | 7/2017 | Sasaki et al. | |
| 2020/0194560 A1 | 6/2020 | Takizawa et al. | |

FOREIGN PATENT DOCUMENTS

| | | |
|---|---|---|
| JP | 2014-127713 A | 7/2014 |
| TW | 201611265 A | 3/2016 |
| WO | 2016/013554 A1 | 1/2016 |

OTHER PUBLICATIONS

Khemka, V. et al., "A Fully Planarized 4H-SiC Trench MOS Barrier Schottky (TMBS) Rectifier", IEEE Electron Device Letters (May 2000), vol. 21, No. 5, pp. 286-288.

Shimizu, T. et al., "IOOV Trench MOS Barrier Schottky Rectifier Using Thick Oxide Layer (TO-TMBS)", Proceedings of 2001 International Symposium on Power Semiconductor Devices & ICs (2001), Osaka, pp. 243-246.

Translation of Preliminary Report on Patentability and Written Opinion dated Nov. 8, 2018 issued in PCT/JP2017/015825.

Extended Supplementary European Search Report dated Nov. 14, 2019 received in European Application No. 17 78 9388.0.

Sasaki K. et al., "Ga2O3 Schottky Barrier Diodes Fabricated by Using Single-Crystal B-Ga2O3 (010) Substrates", IEEE Electron Device Letters 34(4):493-495 (Apr. 2013).

Taiwanese Office Action and Search Report dated Jul. 21, 2020 received in Taiwanese Invention Application No. 106113741, together with an English-language translation.

Japanese Notice of Reasons for Refusal dated May 26, 2020 received in Japanese Application No. 2016-091276, together with an English-language translation.

\* cited by examiner

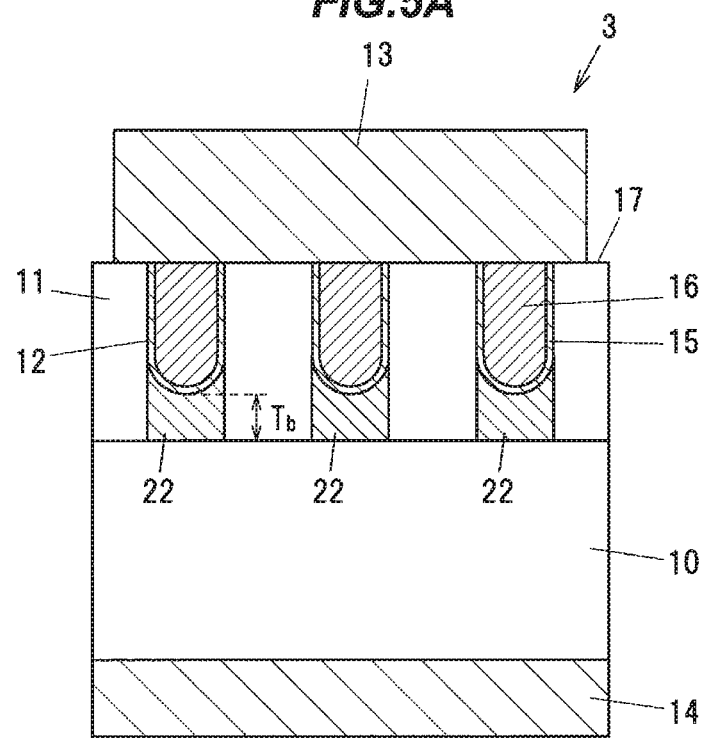
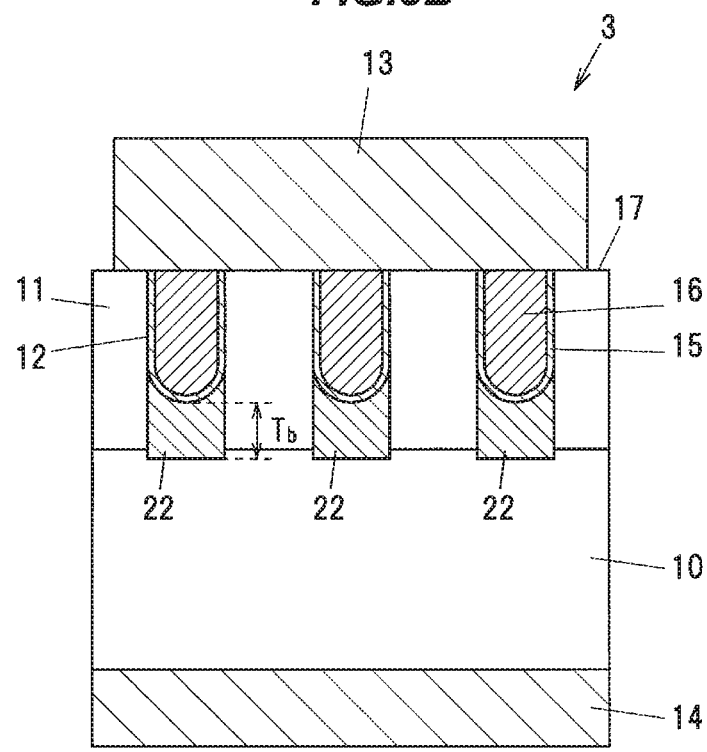

TRENCH MOS-TYPE SCHOTTKY DIODE

TECHNICAL FIELD

The invention relates to a trench MOS-type Schottky diode.

BACKGROUND ART

Schottky barrier diode (Schottky diode) using $Ga_2O_3$ as a semiconductor layer is known (e.g., PTL 1).

In PTL 1, it is described that when an n-$Ga_2O_3$ layer has, e.g., an electron carrier concentration of $9.95 \times 10^{16}$ cm$^{-3}$ and a thickness of 3.3 μm, withstand voltage of the Schottky diode is 1000V.

Trench MOS-type Schottky diode using Si as a semiconductor layer and trench MOS-type Schottky diode using SiC as a semiconductor layer are also known (e.g., NPLs 1 and 2).

In NPL 1, it is described that when an n-Si layer has a doping concentration of $1 \times 10^{16}$ cm$^{-3}$ and a thickness of 9 μm, withstand voltage of the trench MOS-type Schottky diode using Si as a semiconductor layer is 107V.

Based on the reverse voltage/reverse current characteristic described in NPL 2, withstand voltage of the trench MOS-type Schottky diode using SiC as a semiconductor layer is about several tens of V when an n-SiC layer has a doping concentration of $6 \times 10^{15}$ cm$^{-3}$ and a thickness of 4 μm.

CITATION LIST

Patent Literatures

PTL 1: JP 2013/102081 A

Non Patent Literatures

NPL 1: T. Shimizu et al., Proceedings of 2001 International Symposium on Power Semiconductor Devices & ICs, Osaka, pp. 243-246 (2001)
NPL 2: V. Khemka, et al., IEEE ELECTRON DEVICE LETTERS, VOL. 21, NO. 5, MAY 2000, pp. 286-288

SUMMARY OF INVENTION

Technical Problem

In PTL 1, withstand voltage of the Schottky diode is defined by breakdown field strength of $Ga_2O_3$. However, when reverse voltage is increased in a Schottky diode using a material with high breakdown field strength such as $Ga_2O_3$, a leakage current between an anode electrode and a $Ga_2O_3$ layer increases drastically before breakdown of the $Ga_2O_3$ layer occurs, and the Schottky diode burns out.

Thus, it is appropriate that reverse voltage when a leakage current of a predetermined magnitude (e.g., 1 μA) flows is defined as withstand voltage for a Schottky diode using $Ga_2O_3$ as a semiconductor layer. Note that, the Schottky diode described in PTL 1 does not have a special structure to reduce a leakage current and the roughly estimated reverse voltage at a leakage current of 1 μA is about 64V when the n-$Ga_2O_3$ layer has a carrier concentration of $9.95 \times 10^{16}$ cm$^{-3}$.

It is an object of the invention to provide a trench MOS-type Schottky diode having a high withstand voltage and low loss.

Solution to Problem

To achieve the above-mentioned object, an aspect of the invention provides a trench MOS-type Schottky diode defined by [1] to [7] below.

[1] A trench MOS-type Schottky diode, comprising: a first semiconductor layer comprising a $Ga_2O_3$-based single crystal; a second semiconductor layer that is a layer laminated on the first semiconductor layer, and that comprises a $Ga_2O_3$-based single crystal and a trench opened on a surface thereof opposite to the first semiconductor layer, an anode electrode formed on the surface of the second semiconductor layer opposite to the first semiconductor layer; a cathode electrode formed on a surface of the first semiconductor layer opposite to the second semiconductor layer; an insulating film covering the inner surface of the trench of the second semiconductor layer; and a trench MOS gate that is embedded in the trench of the second semiconductor layer so as to be covered with the insulating film and is in contact with the anode electrode.

[2] The trench MOS-type Schottky diode defined by [1], wherein a donor concentration in the second semiconductor layer is not less than $1.0 \times 10^{15}$ cm$^{-3}$ and not more than $3.0 \times 10^{17}$ cm$^{-3}$, and a thickness of the second semiconductor layer is not less than 2.0 μm and not more than 50 μm.

[3] The trench MOS-type Schottky diode defined by [2], wherein the donor concentration in the second semiconductor layer is not less than $3.0 \times 10^{16}$ cm$^{-3}$ and not more than $6.0 \times 10^{16}$ cm$^{-3}$, and the thickness of the second semiconductor layer is not less than 4.5 μm and not more than 9 μm.

[4] The trench MOS-type Schottky diode defined by [3], wherein the thickness of the second semiconductor layer is not less than 5.5 μm.

[5] The trench MOS-type Schottky diode defined by any one of [1] to [4], wherein a lower surface of the insulating film is covered with an insulation having a lower permittivity than the insulating film.

[6] The trench MOS-type Schottky diode defined by [5], wherein a thickness of the insulation immediately under the lowest portion of the insulating film is not less than 200 nm.

[7] The trench MOS-type Schottky diode defined by [5], wherein the insulation is in contact with the first semiconductor layer.

Advantageous Effects of Invention

According to the invention, it is possible to provide a trench MOS-type Schottky diode having a high withstand voltage and low loss.

BRIEF DESCRIPTION OF DRAWINGS

FIG. 5A is a vertical cross-sectional view showing a trench MOS-type Schottky diode in the third embodiment.
FIG. 5B is a vertical cross-sectional view showing a trench MOS-type Schottky diode in the third embodiment.

DESCRIPTION OF EMBODIMENTS

First Embodiment (Configuration of Trench MOS-Type Schottky Diode)

Figure 1:
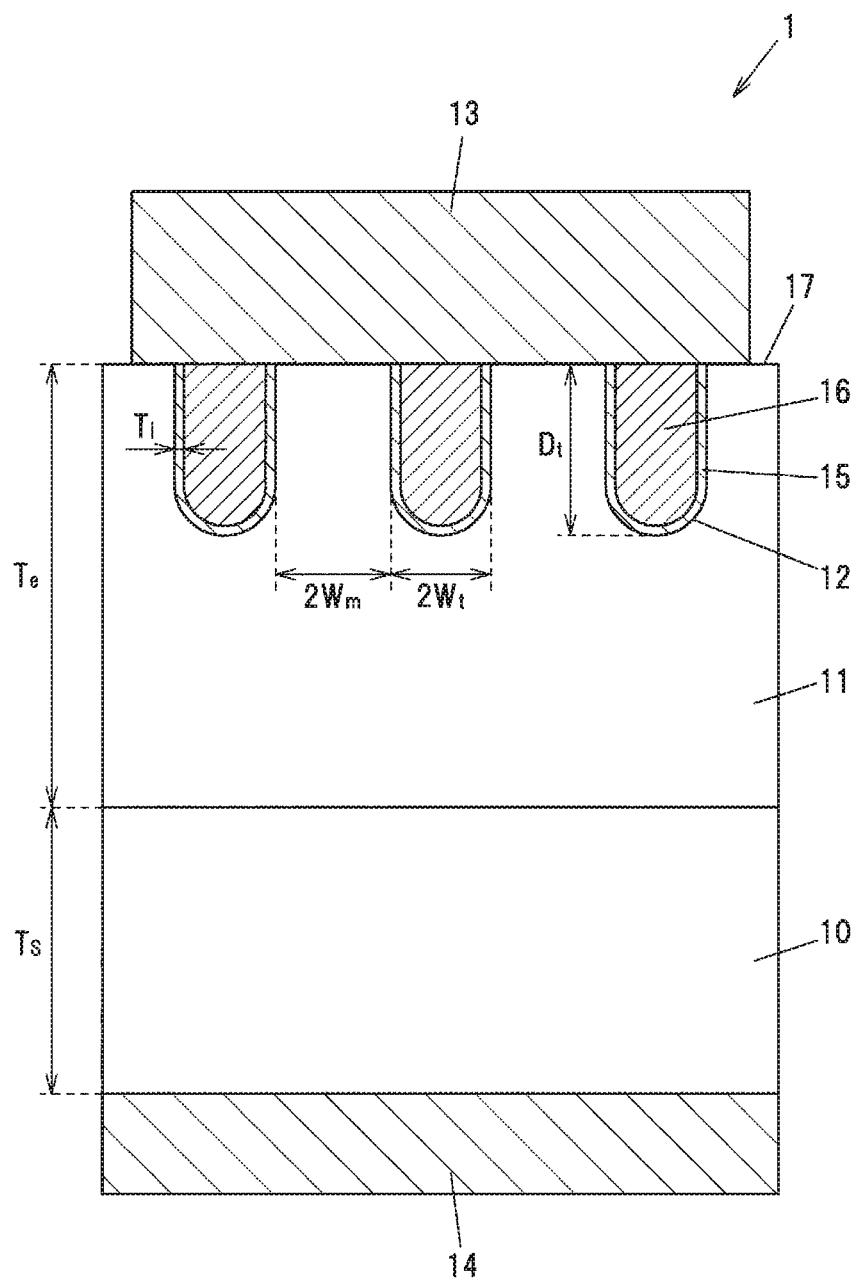
FIG. 1 is a vertical cross-sectional view showing a trench MOS-type Schottky diode in the first embodiment.

FIG. 1 is a vertical cross-sectional view showing a trench MOS-type Schottky diode 1 in the first embodiment. The trench MOS-type Schottky diode 1 is a vertical Schottky diode having a trench MOS region.

The trench MOS-type Schottky diode 1 has a first semiconductor layer 10, a second semiconductor layer 11 which is a layer laminated on the first semiconductor layer 10 and has trenches 12 opened on a surface 17 thereof opposite to the first semiconductor layer 10, an anode electrode 13 formed on the surface 17 of the second semiconductor layer 11, a cathode electrode 14 formed on a surface of the first semiconductor layer 10 opposite to the second semiconductor layer 11, insulating films 15 covering inner surfaces of the trenches 12 of the second semiconductor layer 11, and trench MOS gates 16 which are embedded in the trenches 12 of the second semiconductor layer 11 so as to be covered with the insulating films 15 and are in contact with the anode electrode 13.

In the trench MOS-type Schottky diode 1, an energy barrier at an interface between the anode electrode 13 and the second semiconductor layer 11 as viewed from the second semiconductor layer 11 is lowered by applying forward voltage between the anode electrode 13 and the cathode electrode 14 (positive potential on the anode electrode 13 side), allowing an electric current to flow from the anode electrode 13 to the cathode electrode 14.

On the other hand, when reverse voltage is applied between the anode electrode 13 and the cathode electrode 14 (negative potential on the anode electrode 13 side), the electric current does not flow due to the Schottky barrier. When reverse voltage is applied between the anode electrode 13 and the cathode electrode 14, a depletion layer spreads from an interface between the anode electrode 13 and the second semiconductor layer 11 and from an interface between the insulating films 15 and the second semiconductor layer 11.

In general, the upper limit of reverse leakage current in Schottky diode is set to 1 μA. In the embodiments, reverse voltage when a leakage current of 1 μA flows is defined as withstand voltage.

According to data of dependence of reverse leakage current on electric field strength at Schottky interface in Schottky diode having a SiC semiconductor layer described in, e.g., "Technology of Semiconductor SiC and its Application" by Hiroyuki Matsunami, Noboru Otani, Tsunenobu Kimoto and Takashi Nakamura, Second Edition, Nikkan Kogyo Shimbun, Ltd., Sep. 30, 2011, p. 355, electric field strength immediately under Schottky electrode is about 0.8 MV/cm when a current density of reverse leakage current is 0.0001 A/cm². 0.0001 A/cm² here is a current density immediately under the Schottky electrode when an electric current of 1 μA flows through the Schottky electrode having a size of 1 mm×1 mm.

Thus, even when breakdown field strength of the semiconductor material itself is several MV/cm, a leakage current of more than 1 μA flows when the electric field strength immediately under the Schottky electrode exceeds 0.8 MV/cm.

In order to obtain withstand voltage of 1200V in, e.g., a conventional Schottky diode not having a special structure to reduce electric field strength immediately under Schottky electrode, a donor concentration in a semiconductor layer needs to be reduced to the order of $10^{15}$ cm$^{-3}$ and also the semiconductor layer needs to be very thick so that the electric field strength immediately under the Schottky electrode is kept not more than 0.8 MV/cm. This causes a significant increase in conduction loss, and it is thus difficult to make a Schottky barrier diode having a high withstand voltage and low loss.

The trench MOS-type Schottky diode 1 in the first embodiment has a trench MOS structure and thus can have a high withstand voltage without an increase in resistance of the semiconductor layer. In other words, the trench MOS-type Schottky diode 1 is a Schottky diode having a high withstand voltage and low loss.

Junction barrier Schottky (JBS) diode is known as a Schottky diode having a high withstand voltage and low loss. However, $Ga_2O_3$ is not suitable as a material for the JBS diode requiring a p-type region since it is difficult to manufacture p-type $Ga_2O_3$.

The first semiconductor layer 10 is formed of an n-type $Ga_2O_3$-based single crystal containing a Group IV element, such as Si or Sn, as a donor. A donor concentration $N_d'$ of the first semiconductor layer 10 is, e.g., not less than $1.0\times10^{18}$ and not more than $1.0\times10^{20}$ cm$^{-3}$. A thickness $T_s$ of the first semiconductor layer 10 is, e.g., 10 to 600 μm. The first semiconductor layer 10 is, e.g., a $Ga_2O_3$-based single crystal substrate.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In. The band gap is widened by adding Al and is narrowed by adding In. The $Ga_2O_3$ single crystal mentioned above has, e.g., a β-crystal structure.

The second semiconductor layer 11 is formed of an n-type $Ga_2O_3$-based single crystal containing a Group IV element, such as Si or Sn, as a donor. A donor concentration $N_d$ of the second semiconductor layer 11 is lower than the donor concentration $N_d$ of the first semiconductor layer 10. The second semiconductor layer 11 is, e.g., an epitaxial layer epitaxially grown on the first semiconductor layer 10 which is a $Ga_2O_3$-based single crystal substrate.

A high-donor-concentration layer containing a high concentration of donor may be additionally formed between the first semiconductor layer 10 and the second semiconductor layer 11. The high-donor-concentration layer is used when, e.g., the second semiconductor layer 11 is epitaxially grown on the first semiconductor layer 10 as a substrate. At the early growth stage of the second semiconductor layer 11, the amount of dopant incorporated thereinto is unstable and an acceptor impurity is diffused from the first semiconductor layer 10 as a substrate. Thus, resistance increases in a region of the second semiconductor layer 11 close to the interface with the first semiconductor layer 10 when the second semiconductor layer 11 is grown directly on the first semiconductor layer 10. The high-donor-concentration layer is used to avoid such problems. The concentration in the high-donor-concentration layer is set to be, e.g., higher than the concentration in the second semiconductor layer 11, more preferably, higher than the concentration in the first semiconductor layer 10.

As the donor concentration $N_d$ in the second semiconductor layer 11 increases, electrical field strength in each part of the trench MOS-type Schottky diode 1 increases. The donor concentration $N_d$ in the second semiconductor layer 11 is preferably not more than about $6.0\times10^{16}$ cm$^{-3}$ to lower the maximum electric field strength in a region of the second semiconductor layer 11 immediately under the anode electrode 13, the maximum electric field strength in the second semiconductor layer 11 and the maximum electric field strength in the insulating film 15. On the other hand, as the donor concentration $N_d$ decreases, resistance of the second semiconductor layer 11 increases and the forward loss increases. Therefore, to obtain withstand voltage of, e.g., not more than 1200V, the donor concentration $N_d$ is preferably not less than $3.0\times10^{16}$ cm$^{-3}$. However, to obtain higher withstand voltage, the donor concentration $N_d$ is preferably reduced to, e.g., about $1.0\times10^{16}$ cm$^{-3}$.

As a thickness $T_e$ of the second semiconductor layer 11 increases, the maximum electric field strength in the second semiconductor layer 11 and the maximum electric field strength in the insulating film 15 decrease. By adjusting the thickness $T_e$ of the second semiconductor layer 11 to not less than about 6 μm, it is possible to effectively reduce the maximum electric field strength in the second semiconductor layer 11 and the maximum electric field strength in the insulating film 15. In view of reduction in these maximum electric field strengths and downsizing of the trench MOS-type Schottky diode 1, the thickness $T_e$ of the second semiconductor layer 11 is preferably about not less than 5.5 μm and not more than 9 μm.

Electrical field strength in each part of the trench MOS-type Schottky diode 1 changes depending on a depth $D_t$ of the trench 12. The depth $D_t$ of the trench 12 is preferably about not less than 2 μm and not more than 6 μm, more preferably, about not less than 3 μm and not more than 4 μm to lower the maximum electric field strength in a region of the second semiconductor layer 11 immediately under the anode electrode 13, the maximum electric field strength in the second semiconductor layer 11 and the maximum electric field strength in the insulating film 15. In the present specification, half of the width of the trench 12 (hereinafter, referred to as "½ width") is denoted as $W_t$.

As a width of a mesa-shaped portion between adjacent trenches 12 on the second semiconductor layer 11 decreases, the maximum electric field strength in a region of the second semiconductor layer 11 immediately under the anode electrode 13 decreases. In the present specification, half of the width of the mesa-shaped portion between adjacent trenches 12 (hereinafter, referred to as "½ width") is denoted as $W_m$. The ½ width $W_m$ of the mesa-shaped portion is preferably not more than 1.25 μm to lower the maximum electric field strength in a region of the second semiconductor layer 11 immediately under the anode electrode 13. At the same time, the ½ width $W_m$ of the mesa-shaped portion is preferably not less than 0.25 μm since it is more difficult to make the trench 12 when the width of the mesa-shaped portion is smaller.

Since the maximum electric field strength in the insulating film 15 decreases as permittivity of the insulating film 15 increases, the insulating film 15 is preferably formed of a high-permittivity material. For example, $Al_2O_3$ (relative permittivity of about 9.3) and $HfO_2$ (relative permittivity of about 22) can be used as a material of the insulating film 15, and it is particularly preferable to use $HfO_2$ which has high permittivity.

Meanwhile, as a thickness $T_i$ of the insulating film 15 increases, the maximum electric field strength in the second semiconductor layer 11 decreases but the maximum electric field strength in the insulating film 15 and the maximum electric field strength in a region of the second semiconductor layer 11 immediately under the anode electrode 13 increase. In view of ease of manufacturing, the thickness of the insulating film 15 is preferably smaller, and is more preferably not more than 300 nm. It is, however, obvious that a certain thickness is required so that an electric current virtually does not flow directly between the trench MOS gate 16 and the second semiconductor layer 11.

The material of the trench MOS gate 16 is not specifically limited as long as it is electrically conductive, and it is possible to use, e.g., polycrystalline Si doped at a high concentration and a metal such as Ni or Au.

Electric field strength in the trench MOS-type Schottky diode 1 is affected by the width of the mesa-shaped portion between two adjacent trenches 12, the depth $D_t$ of the trench 12 and the thickness $T_i$ of the insulating film 15, etc., as described above, but is hardly affected by a planar pattern of the trenches 12. Thus, the planar pattern of the trenches 12 on the second semiconductor layer 11 is not specifically limited.

Figure 2A:
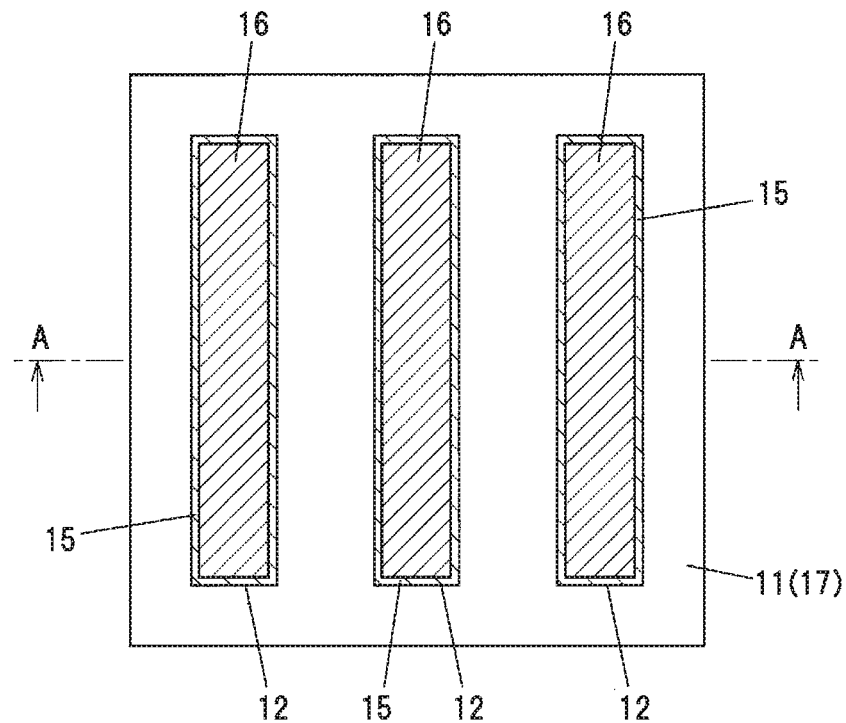
FIG. 2A is a top view showing a typical example of a planar trench pattern on a second semiconductor layer.
Figure 2B:
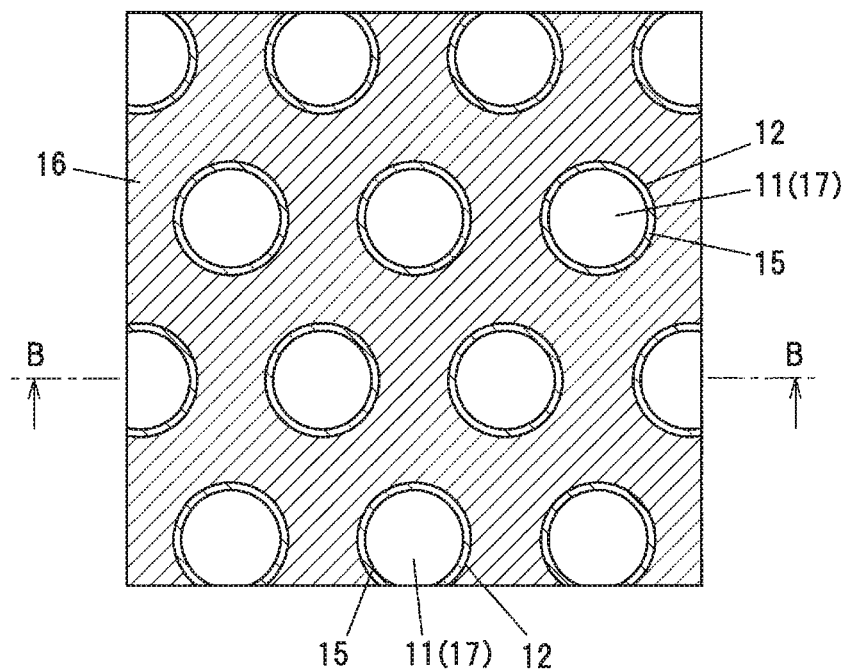
FIG. 2B is a top view showing another typical example of a planar trench pattern on the second semiconductor layer.

FIGS. 2A and 2B are top views respectively showing typical examples of the planar pattern of the trenches 12 on the surface 17 of the second semiconductor layer 11.

The trenches 12 shown in FIG. 2A are formed in a line-shaped planar pattern. The trenches 12 shown in FIG. 2B are formed in a planar pattern with dots each of which is the mesa-shaped portion between two adjacent trenches 12.

The cross section of the trench MOS-type Schottky diode 1 shown in FIG. 1 corresponds to a cross section cut along line A-A in case of the trench MOS-type Schottky diode 1 shown in FIG. 2A and a cross section cut along line B-B in case of the trench MOS-type Schottky diode 1 shown in FIG. 2B.

The anode electrode 13 is in Schottky contact with the second semiconductor layer 11.

The anode electrode 13 is formed of Pt, Pd, Au, Ni, Ag, Cu, Al, Mo, In, Ti or polycrystalline Si, or oxide, nitride or alloy thereof, etc. A reverse leakage current at an interface between the anode electrode 13 and the second semiconductor layer 11 is smaller when a height of a barrier (barrier height) at the interface between the anode electrode 13 and the second semiconductor layer 11 is higher. Meanwhile, when a metal with a high barrier height is used to form the anode electrode 13, forward rising voltage increases and the forward loss thus increases. Therefore, it is preferable to select a material having a barrier height so that the reverse leakage current is about 1 µA at a maximum. When reverse withstand voltage is, e.g., 600V to 1200V, it is possible to maximize reduction of forward loss by adjusting the barrier height to about 0.7 eV while keeping the reverse leakage current down to about 1 µA. The anode electrode 13 may have a multilayer structure formed by laminating different metal films, e.g., Pt/Au, Pt/Al, Pd/Au, Pd/Al, Pt/Ti/Au or Pt/Ti/Au.

The cathode electrode 14 is in ohmic contact with the first semiconductor layer 10. The cathode electrode 14 is formed of a metal such as Ti. The cathode electrode 14 may have a multilayer structure formed by laminating different metal films, e.g., Ti/Au or Ti/Al. For reliable ohmic contact between the cathode electrode 14 and the first semiconductor layer 10, the cathode electrode 14 is preferably configured that a layer in contact with the first semiconductor layer 10 is formed of Ti.

Figure 3:
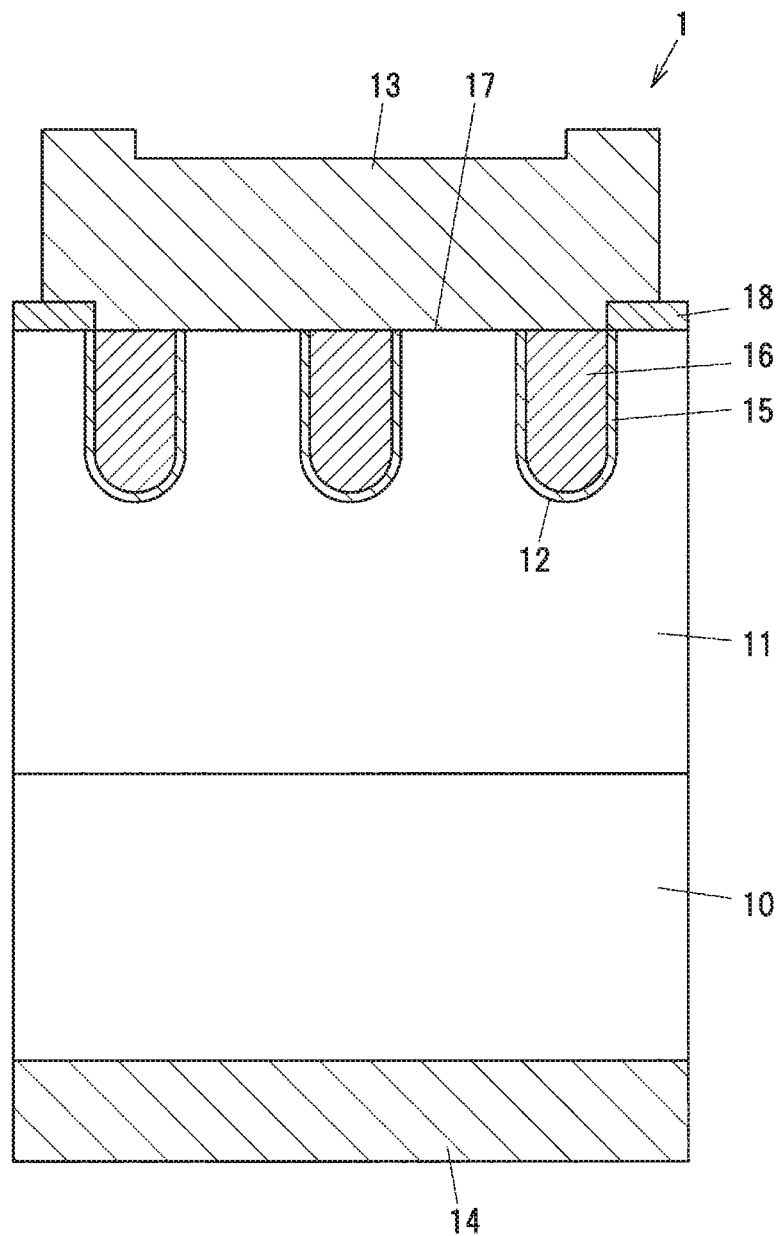
FIG. 3 is a vertical cross-sectional view showing a modification of the trench MOS-type Schottky diode in the first embodiment.

FIG. 3 is a vertical cross-sectional view showing a modification of the trench MOS-type Schottky diode 1 in the first embodiment. The trench MOS-type Schottky diode 1 may have a field-plate structure as shown in FIG. 3.

In the modification shown in FIG. 3, a dielectric film 18 formed of $SiO_2$, etc., is provided along an edge of the surface 17 of the second semiconductor layer 11 and the anode electrode 13 is arranged so that an edge thereof rides on the dielectric film 18.

By providing such field-plate structure, it is possible to prevent the electric field from concentrating at an edge portion of the anode electrode 13. The dielectric film 18 also serves as a passivation film for preventing a surface leakage current which flows along the surface 17 of the second semiconductor layer 11. Having or not having the field-plate structure does not affect the optimal values of various parameters (the ½ width $W_m$ of the mesa-shaped portion, the depth $D_t$ of the trench 12, the thickness $T_i$ of the insulating film 15, etc.) of the structure of the trench MOS-type Schottky diode 1.

Second Embodiment

The second embodiment is different from the first embodiment in that an insulation different from the insulation constituting the insulating film 15 is embedded at the bottom of each trench. The explanation of the same features as those in the first embodiment will be omitted or simplified.

Configuration of Trench MOS-Type Schottky Diode

Figure 4:
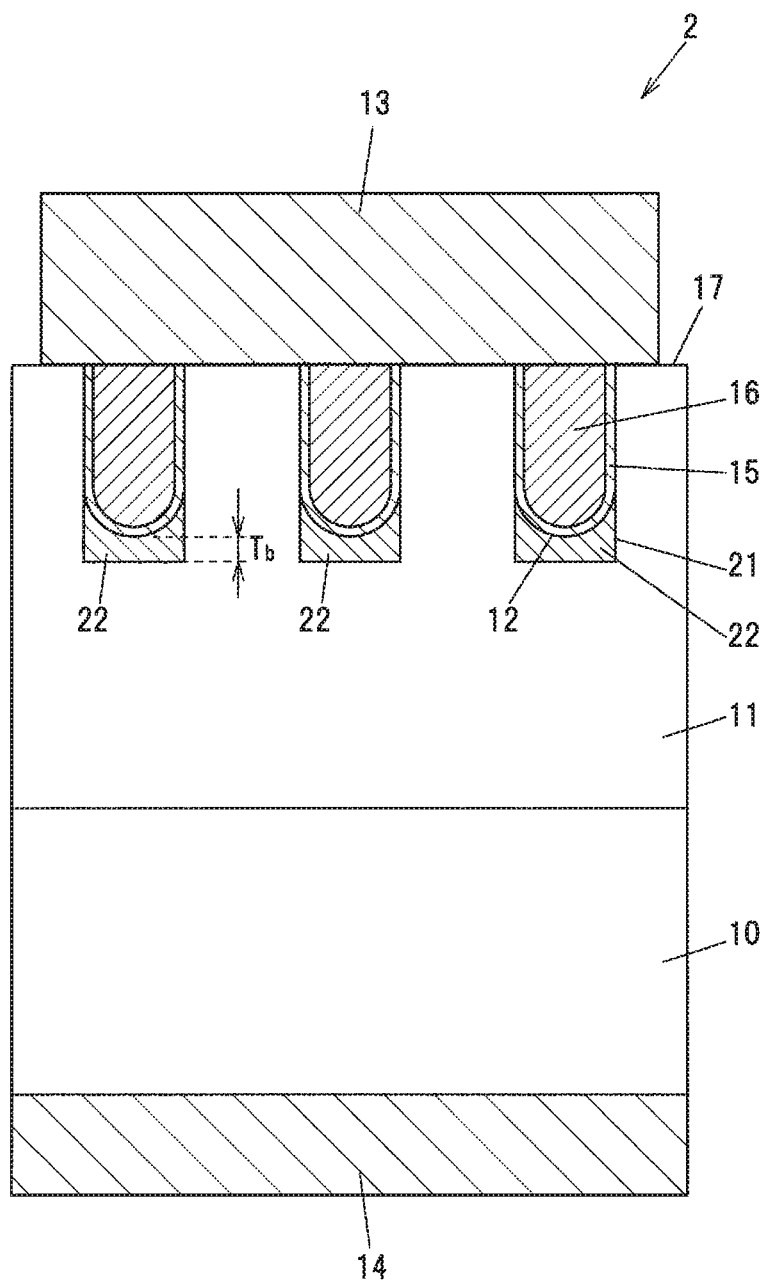
FIG. 4 is a vertical cross-sectional view showing a trench MOS-type Schottky diode in the second embodiment.

FIG. 4 is a vertical cross-sectional view showing a trench MOS-type Schottky diode 2 in the second embodiment.

The second semiconductor layer 11 of the trench MOS-type Schottky diode 2 has trenches 21 opened on the surface 17. An insulation 22 is embedded at the bottom of each trench 21 and the insulating film 15 covers the upper surface of the insulation 22 and the inner side surface of the trench 21. The trench MOS gate 16 is embedded in each trench 21 so as to be covered with the insulating film 15.

For example, after embedding the insulation 22 at the bottom of the trench 21, an upper portion of the insulation 22 is roundly removed by etching to form the trench 12. Then, the insulating film 15 and the trench MOS gate 16 are formed in the trench 12. The bottom surface of the trench 21 may be flat or may be rounded in the same manner as the trench 12.

The insulation 22 is formed of an insulating material with a lower permittivity than the insulating film 15. Therefore, when voltage is applied between the anode electrode 13 and the cathode electrode 14, an electric field applied to the insulation 22 is larger than that applied to the insulating film 15.

In the trench MOS-type Schottky diode 1 of the first embodiment, the insulating film 15 has the highest electrical field strength in a region close to the bottom of the trench 12. Meanwhile, the second semiconductor layer 11 has the highest electrical field strength in a region immediately under the trench 12.

By providing the insulation 22 of the second embodiment, it is possible to reduce the electrical field strength in a region of the insulating film 15 close to the bottom of the trench 12 and the electrical field strength in a region of the second semiconductor layer 11 immediately under the trench 12. In other words, it is possible to reduce the maximum electric field strength in the insulating film 15 and the maximum electric field strength in the second semiconductor layer 11.

The insulation 22 is preferably formed of a material with a low permittivity such as $SiO_2$ (relative permittivity of about 4). A thickness $T_b$ of the insulation 22 immediately under the lowest portion of the insulating film 15 is preferably not less than about 200 nm. The insulation 22 has the same planar pattern as the trench 12 and typically has a width substantially equal to the width of the trench 12 (=$2W_t$).

Third Embodiment

The third embodiment is different from the second embodiment in that the insulations 22 are in contact with the first semiconductor layer 10. The explanation of the same features as those in the second embodiment will be omitted or simplified.

Configuration of Trench MOS-Type Schottky Diode

FIGS. 5A and 5B are vertical cross-sectional views showing a trench MOS-type Schottky diode 3 in the third embodiment.

The thickness $T_b$ of the insulation 22 is larger in the trench MOS-type Schottky diode 3 than in the trench MOS-type Schottky diode 2 of the second embodiment. Thus, it is possible to provide sufficient withstand voltage only by the insulations 22, unlike the trench MOS-type Schottky diode 2 which uses the insulations 22 and the second semiconductor layer 11 to provide sufficient withstand voltage.

Thus, the thickness $T_e$ of the second semiconductor layer 11 can be reduced to the level at which the insulations 22 are in contact with the first semiconductor layer 10, and on-resistance can be thereby reduced. In other words, when the trench MOS-type Schottky diode 2 and the trench MOS-type Schottky diode 3 are designed to have the same withstand voltage, on-resistance of the trench MOS-type Schottky diode 3 can be reduced to lower than on-resistance of the trench MOS-type Schottky diode 2, hence, loss can be further reduced.

The insulation 22 of the trench MOS-type Schottky diode 3 may be provided so that the bottom portion thereof is in contact with the upper surface of the first semiconductor layer 10 as shown in FIG. 5A or sinks into the first semiconductor layer 10 as shown in FIG. 5B. In other words, the height of the lowest portion of the insulation 22 may be the same as the height of the interface between the first semiconductor layer 10 and the second semiconductor layer 11, or may be lower than the height of the interface between the first semiconductor layer 10 and the second semiconductor layer 11.

Effects of the Embodiments

According to the first to third embodiments, it is possible to provide a trench MOS-type Schottky diode having a high withstand voltage and low loss by using $Ga_2O_3$ as semiconductor layers.

Example 1

The optimal values of various parameters of the structure of the trench MOS-type Schottky diode 1 in the first embodiment were derived by performing simulations. The simulations were performed to find a relation between each parameter and the maximum electric field strength in the second semiconductor layer 11/the maximum electric field strength in the insulating film 15/the maximum electric field strength in a region of the second semiconductor layer 11 immediately under the anode electrode 13 (in a region from the interface with the anode electrode 13 to the depth of 0.5 μm).

Here, $P_1$ denotes a point with the highest electrical field strength E in the second semiconductor layer 11, $P_2$ denotes a point with the highest electrical field strength E in the insulating film 15, and $P_3$ denotes a point with the highest electrical field strength E in a region of the second semiconductor layer 11 immediately under the anode electrode 13. In other words, the electrical field strength E at the point $P_1$ is the maximum electric field strength in the second semiconductor layer 11, the electrical field strength E at the point $P_2$ is the maximum electric field strength in the insulating film 15, and the electrical field strength E at the point $P_3$ is the maximum electric field strength in a region of the second semiconductor layer 11 immediately under the anode electrode 13.

Figure 6:
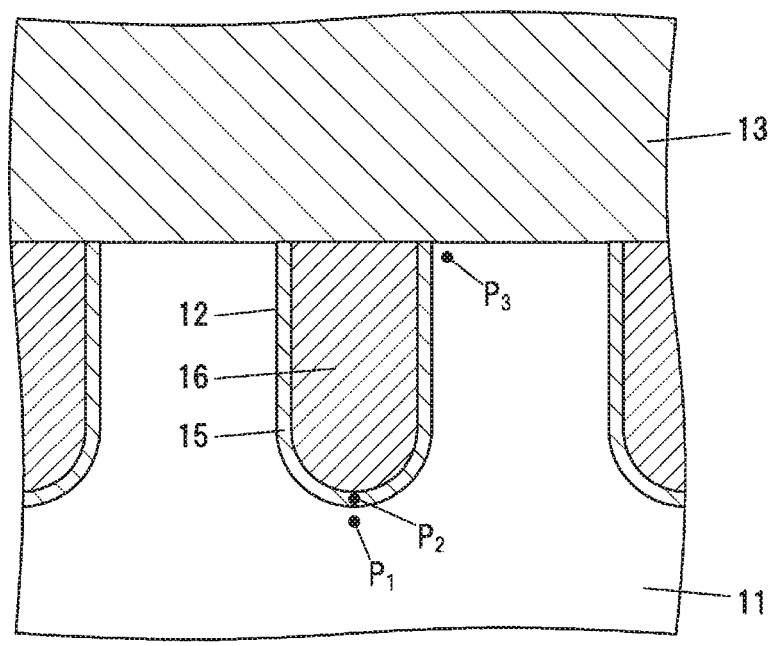
FIG. 6 schematically shows the positions of points $P_1$, $P_2$ and $P_3$ in the trench MOS-type Schottky diode in the simulations performed in Example.

FIG. 6 schematically shows the positions of the points $P_1$, $P_2$ and $P_3$ in the trench MOS-type Schottky diode 1 in the simulations performed in Example 1.

In Example 1, one of the structural parameters shown in Table 1 below was changed in each simulation. The parameters fixed in the respective simulations are shown in the graphs (FIGS. 7 to 12) showing the respective simulation results. The parameters ($W_f$, $W_m$, $W_t$, $N_d'$, $V_b$) of which values were not changed in all simulations are not shown in the graphs of FIGS. 7 to 12.

TABLE 1

| | |
|---|---|
| Work function $W_f$ of anode electrode 13 | 5.32 eV |
| ½ width $W_m$ of mesa-shaped portion | 0.5 μm |
| ½ width $W_t$ of trench 12 | 1.0 μm |
| Thickness $T_i$ of insulating film 15 | 20-500 nm |
| Thickness $T_e$ of second semiconductor layer 11 | 4-9 μm |
| Depth $D_t$ of trench 12 | 1-7 μm |
| Relative permittivity $\varepsilon_s$ of insulating film 15 | 9.3 or 22 |
| Donor concentration $N_d'$ of first semiconductor layer 10 | $1.0 \times 10^{19}$ cm$^{-3}$ |
| Donor concentration $N_d$ of second semiconductor layer 11 | $3.0 \times 10^{16}$-$8.0 \times 10^{16}$ cm$^{-3}$ |
| Applied voltage $V_b$ | 1200 V |

Figure 7A:
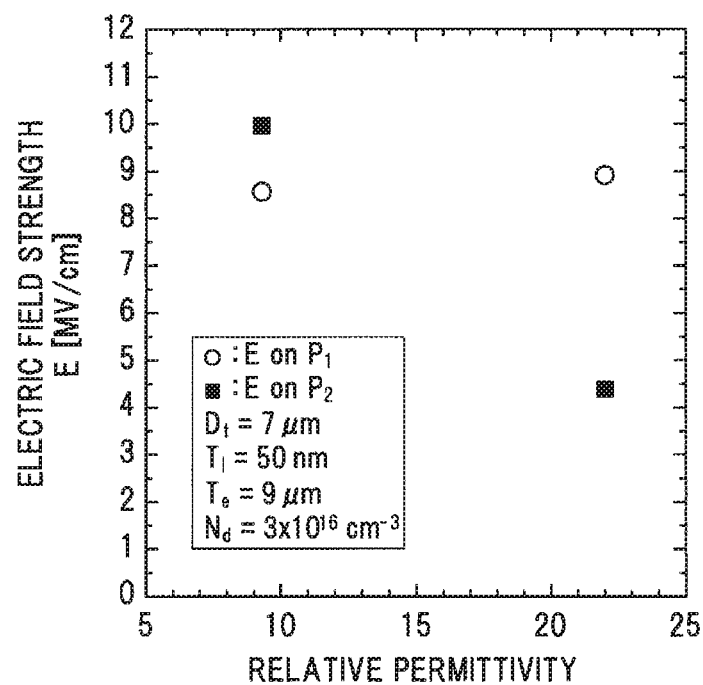
FIG. 7A shows a relation between relative permittivity of an insulating film and electrical field strength E at the points $P_1$ and $P_2$.
Figure 7B:
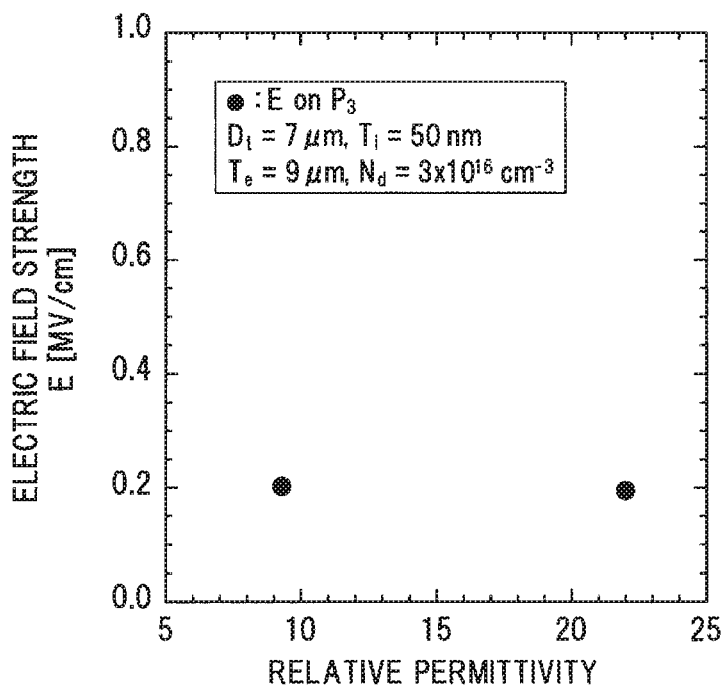
FIG. 7B shows a relation between relative permittivity of the insulating film and electrical field strength E at the point $P_3$.

FIGS. 7A and 7B show a relation between relative permittivity of the insulating film 15 and the electrical field strength E at the points $P_1$, $P_2$ and $P_3$. The relative permittivity 9.3 and 22 in FIGS. 7A and 7B respectively correspond to relative permittivity of $Al_2O_3$ and that of $HfO_2$.

FIG. 7A shows that the maximum electric field strength in the insulating film 15 decreases as permittivity of the insulating film 15 increases.

Figure 8A:
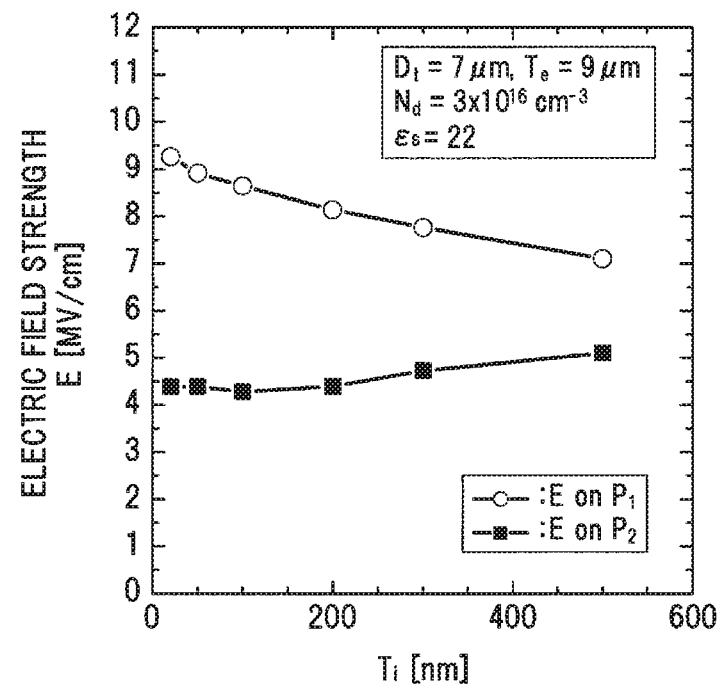
FIG. 8A shows a relation between thickness $T_i$ of the insulating film and electrical field strength E at the points $P_1$ and $P_2$.
Figure 8B:
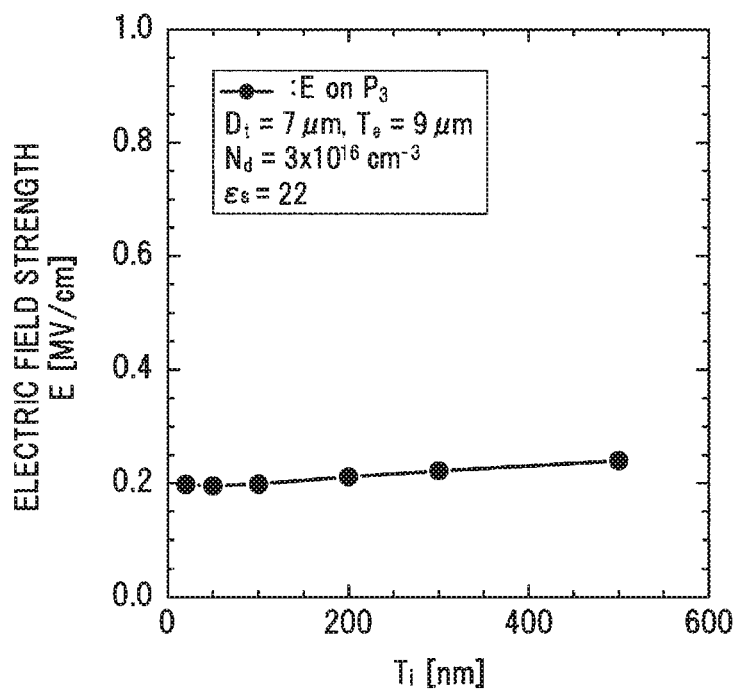
FIG. 8B shows a relation between thickness $T_i$ of the insulating film and electrical field strength E at the point $P_3$.

FIGS. 8A and 8B show a relation between the thickness $T_i$ of the insulating film 15 and the electrical field strength E at the points $P_1$, $P_2$ and $P_3$.

FIG. 8A shows that the maximum electric field strength in the second semiconductor layer 11 decreases as the thickness $T_i$ of the insulating film 15 increases.

In a literature, "M. Higashiwaki et al., Appl. Phys. Lett. 100, 013504 (2012)", it is reported that dielectric breakdown strength of $Ga_2O_3$ is about 8 MV/cm. Based on FIG. 8A, the maximum electric field strength in the second semiconductor layer 11 can be reduced to less than 8 MV/cm when the thickness $T_i$ of the insulating film 15 is adjusted to not less than 300 nm.

Since dielectric breakdown strength of the insulating film 15 as an insulation is very high, the electric field strength in the insulating film 15 does not reach the dielectric breakdown strength under the conditions of this simulation, and does not cause any problem even when increased.

Figure 9A:
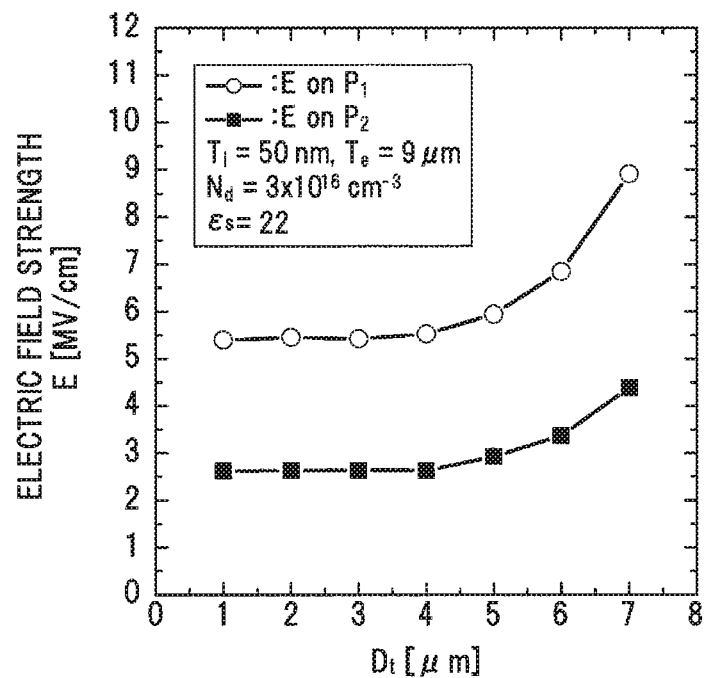
FIG. 9A shows a relation between depth $D_t$ of a trench and electrical field strength E at the points $P_1$ and $P_2$.
Figure 9B:
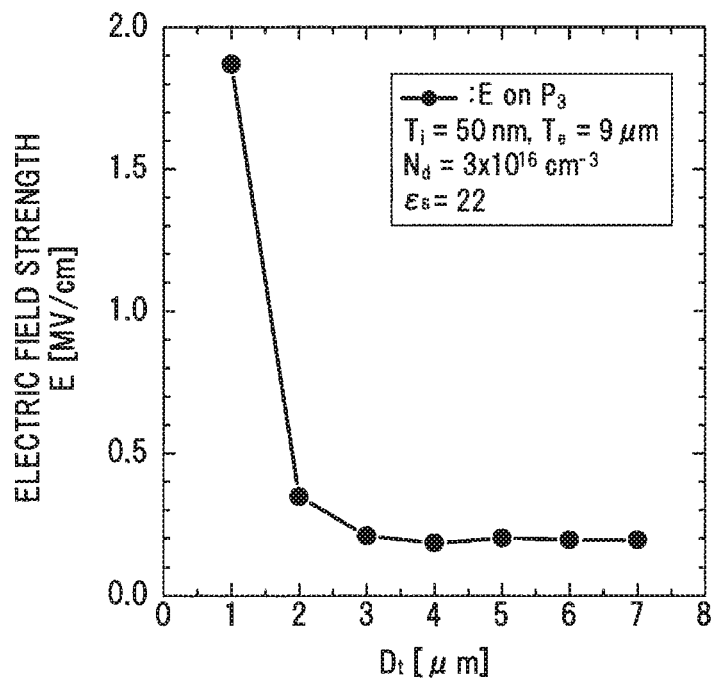
FIG. 9B shows a relation between depth $D_t$ of the trench and electrical field strength E at the point $P_3$.

FIGS. 9A and 9B show a relation between the depth $D_t$ of the trench 12 and the electrical field strength E at the points $P_1$, $P_2$ and $P_3$.

Based on FIG. 9A, the maximum electric field strength in the second semiconductor layer 11 and the maximum electric field strength in the insulating film 15 can be kept low when the depth $D_t$ of the trench 12 is not more than about 6 μm, preferably not more than 4 μm. Meanwhile, FIG. 9B shows that the maximum electric field strength in a region of the second semiconductor layer 11 immediately under the anode electrode 13 can be kept low when the depth $D_t$ of the trench 12 is not less than about 2 μm, preferably not less than 3 μm.

Figure 10A:
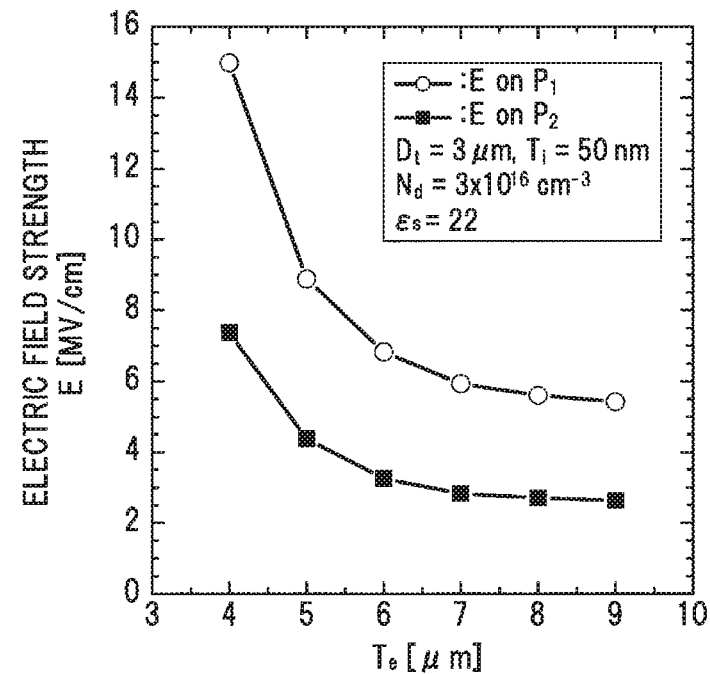
FIG. 10A shows a relation between thickness $T_e$ of the second semiconductor layer and electrical field strength E at the points $P_1$ and $P_2$.
Figure 10B:
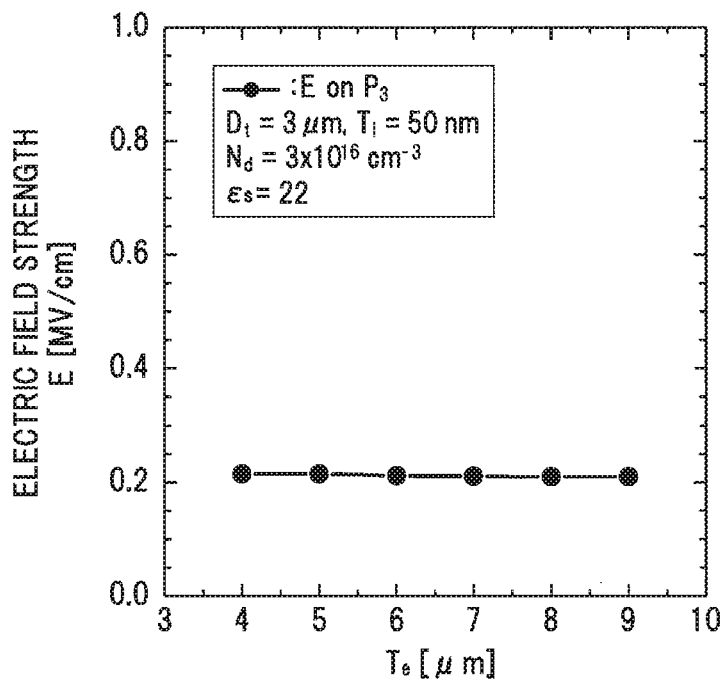
FIG. 10B shows a relation between thickness $T_e$ of the second semiconductor layer and electrical field strength E at the point $P_3$.

FIGS. 10A and 10B show a relation between the thickness $T_e$ of the second semiconductor layer 11 and the electrical field strength E at the points $P_1$, $P_2$ and $P_3$.

Based on FIG. 10A, the maximum electric field strength in the second semiconductor layer 11 can be reduced to less than 8 MV/cm, which is dielectric breakdown strength of $Ga_2O_3$, when the thickness $T_e$ of the second semiconductor layer 11 is adjusted to about not less than 5.5 μm.

Figure 11A:
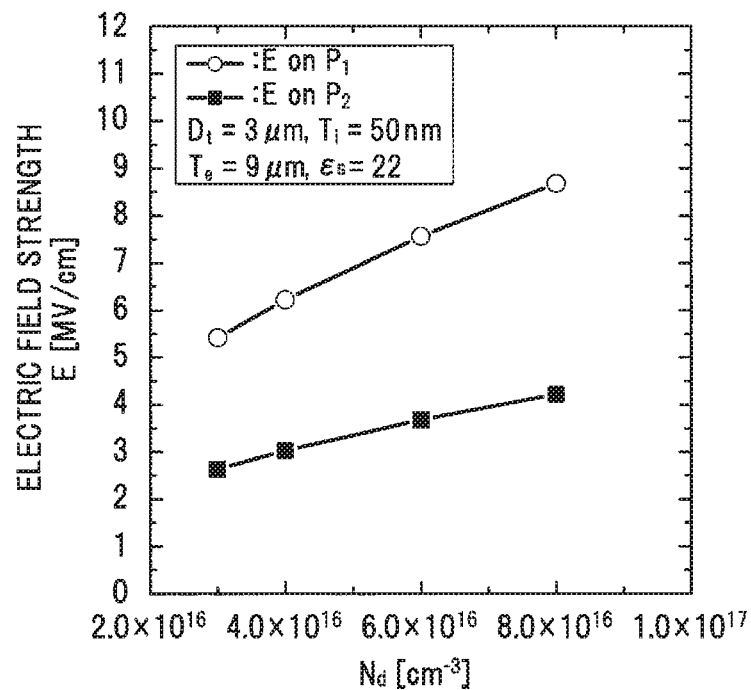
FIG. 11A shows a relation between donor concentration $N_d$ in the second semiconductor layer and electrical field strength E at the points $P_1$ and $P_2$.
Figure 11B:
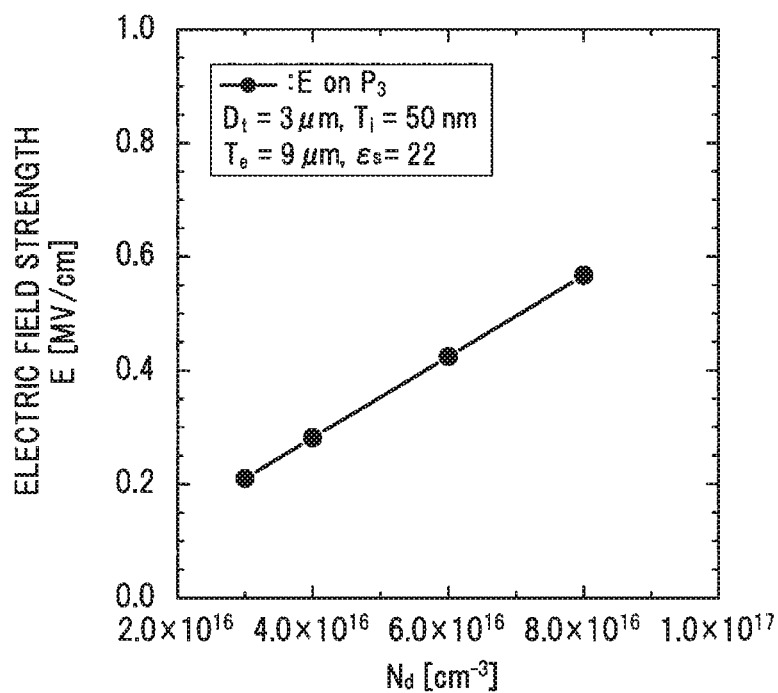
FIG. 11B shows a relation between donor concentration $N_d$ in the second semiconductor layer and electrical field strength E at the point $P_3$.

FIGS. 11A and 11B show a relation between the donor concentration $N_d$ in the second semiconductor layer 11 and the electrical field strength E at the points $P_1$, $P_2$ and $P_3$.

Based on FIGS. 11A and 11B, the smaller the donor concentration $N_d$ in the second semiconductor layer 11, the smaller the maximum electric field strength in a region of the second semiconductor layer 11 immediately under the anode electrode 13, the maximum electric field strength in the second semiconductor layer 11 and the maximum electric field strength in the insulating film 15. In addition, based on FIG. 11A, the maximum electric field strength in the second semiconductor layer 11 can be reduced to less than 8 MV/cm, which is dielectric breakdown strength of $Ga_2O_3$, when the donor concentration $N_d$ in the second semiconductor layer 11 is adjusted to about not more than $6.0 \times 10^{16}$ $cm^{-3}$.

Figure 12A:
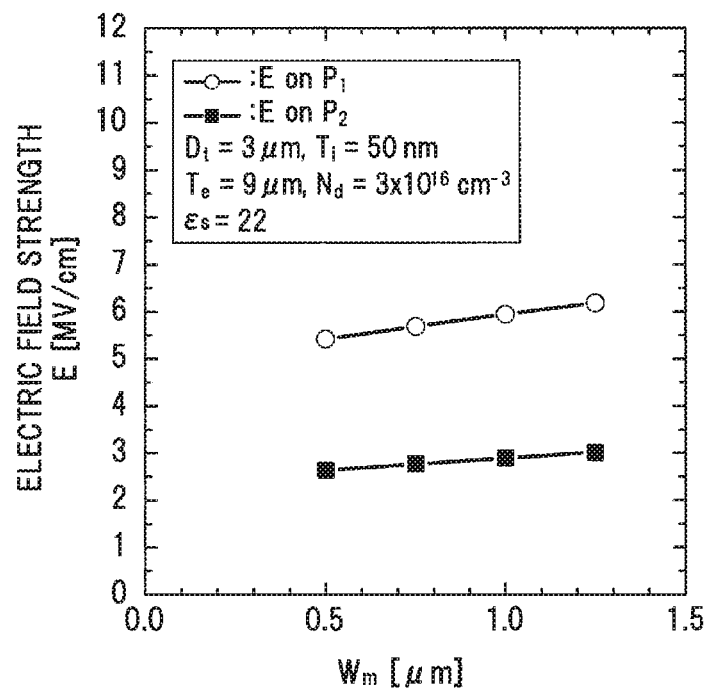
FIG. 12A shows a relation between ½ width $W_m$ of a mesa-shaped portion between adjacent trenches and electrical field strength E at the points $P_1$ and $P_2$.
Figure 12B:
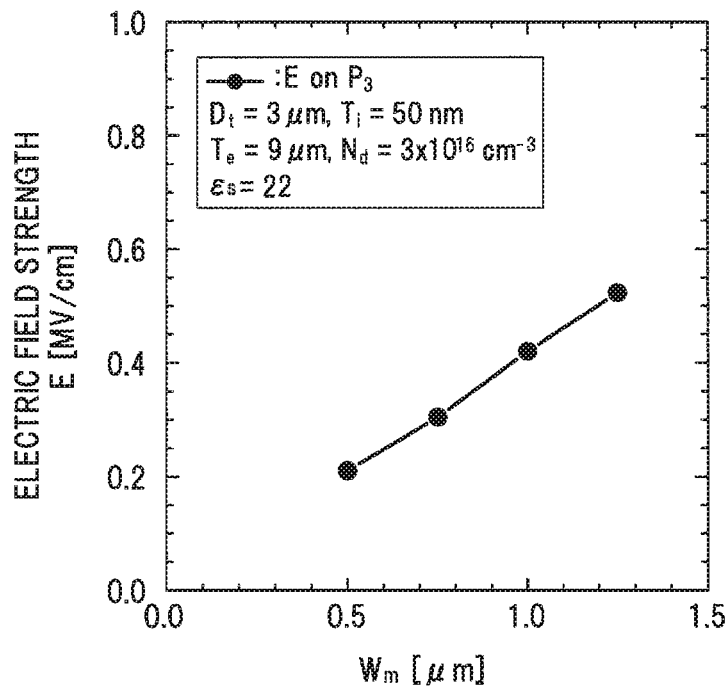
FIG. 12B shows a relation between ½ width $W_m$ of the mesa-shaped portion between adjacent trenches and electrical field strength E at the point $P_3$.

FIGS. 12A and 12B show a relation between the ½ width $W_m$ of the mesa-shaped portion between adjacent trenches 12 and the electrical field strength E at the points $P_1$, $P_2$ and $P_3$.

FIGS. 12A and 12B show that the width of the mesa-shaped portion has a large impact particularly on the maximum electric field strength in a region of the second semiconductor layer 11 immediately under the anode electrode 13. Based on FIG. 12B, the maximum electric field strength in a region of the second semiconductor layer 11 immediately under the anode electrode 13 decreases as the width of the mesa-shaped portion decreases.

Figure 13:
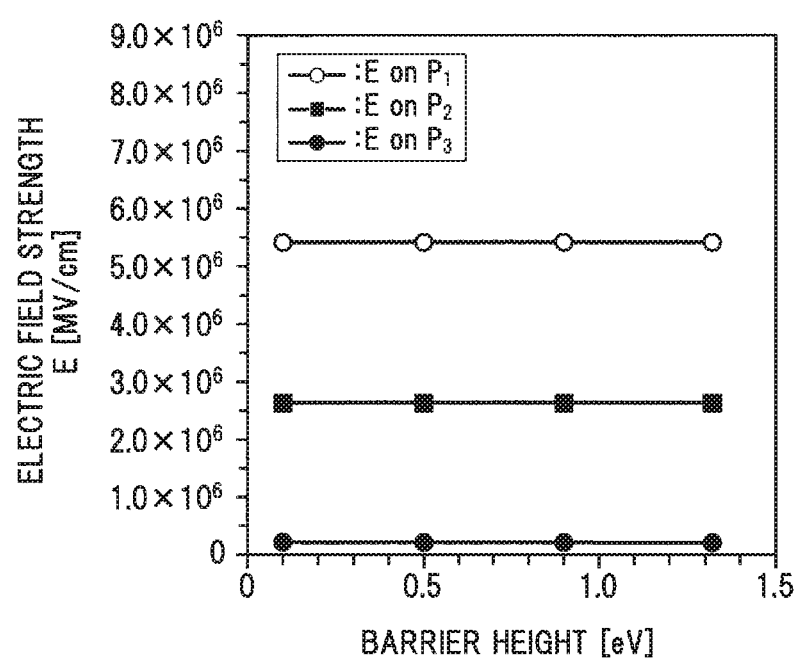
FIG. 13 shows a relation between electrical field strength E at the points $P_1$, $P_2$, $P_3$ and barrier height at an interface between an anode electrode and the second semiconductor layer.

FIG. 13 shows a relation between the electrical field strength E at the points $P_1$, $P_2$, $P_3$ and the barrier height at an interface between the anode electrode 13 and the second semiconductor layer 11.

FIG. 13 shows that the maximum electric field strength in a region of the second semiconductor layer 11 immediately under the anode electrode 13, the maximum electric field strength in the second semiconductor layer 11 and the maximum electric field strength in the insulating film 15 do not depend on the barrier height at the interface between the anode electrode 13 and the second semiconductor layer 11.

Considering the above-mentioned simulation results as well as the fact that the withstand voltage increases with decrease in the donor concentration $N_d$, withstand voltage increases with increase in the thickness $T_e$ of the second semiconductor layer 11 and the thickness $T_e$ of the second semiconductor layer 11 is preferably not more than about 9 μm in view of downsizing of the trench MOS-type Schottky diode 1, the donor concentration $N_d$ of about not less than $3.0 \times 10^{16}$ $cm^{-3}$ and not more than $6.0 \times 10^{16}$ $cm^{-3}$ and the thickness $T_e$ of the second semiconductor layer 11 of about not less than 5.5 μm and not more than 9 μm are preferable to form an element with a withstand voltage of 1200V.

In case that withstand voltage can be smaller than 1200V, the thickness $T_e$ of the second semiconductor layer 11 can be further reduced. For example, when forming an element with a withstand voltage of 600V, the donor concentration $N_d$ is about not less than $3.0 \times 10^{16}$ $cm^{-3}$ and not more than $6.0 \times 10^{16}$ $cm^{-3}$ and the thickness $T_e$ of the second semiconductor layer 11 is about not less than 4.5 μm and not more than 9 μm.

Table 2 below shows examples of structural parameters of the trench MOS-type Schottky diode 1 with a withstand voltage of 1200V which were derived based on the simulation results described above.

TABLE 2

| | |
|---|---|
| ½ width $W_m$ of mesa-shaped portion | 0.5 μm |
| ½ width $W_t$ of trench 12 | 1 μm |
| Thickness $T_i$ of insulating film 15 | 50 nm |
| Thickness $T_e$ of second semiconductor layer 11 | 7 μm |
| Depth $D_t$ of trench 12 | 3 μm |
| Relative permittivity $\varepsilon_s$ of insulating film 15 | 22 ($HfO_2$) |
| Donor concentration $N_d'$ of first semiconductor layer 10 | Not less than $1.0 \times 10^{19}$ $cm^{-3}$ |
| Thickness $T_s$ of first semiconductor layer 10 | Not more than 100 μm |
| Donor concentration $N_d$ of second semiconductor layer 11 | $3.0 \times 10^{16}$ $cm^{-3}$ |

On-resistance of the second semiconductor layer 11 and that of the first semiconductor layer 10 were respectively 1.6 mΩcm² and 0.05 mΩcm². On-resistance of the second semiconductor layer 11 not having a trench structure, when calculated from resistivity of the second semiconductor layer 11, is 1.3 mΩcm², and 1.6 mΩcm² is the value derived on the assumption that the loss rises 1.2-fold due to the trench structure.

Figure 14:
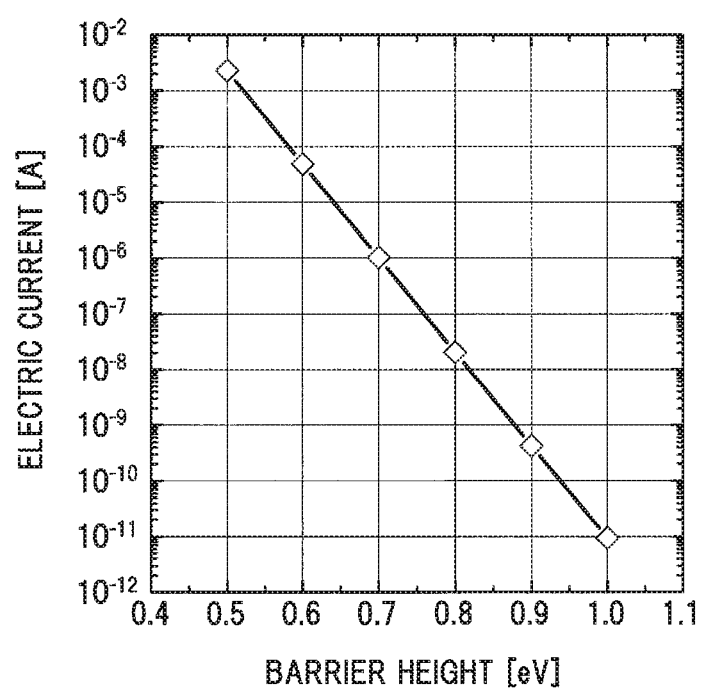
FIG. 14 shows a relation between reverse leakage current and barrier height at the interface between the anode electrode and the second semiconductor layer.

FIG. 14 shows a relation between reverse leakage current and the barrier height at the interface between the anode electrode 13 and the second semiconductor layer 11. The relation between the barrier height and the reverse leakage current shown in FIG. 14 was obtained from theoretical calculation, taking into account thermionic emission as well as mirror effect and on the assumption that the electrical field strength immediately under the anode electrode is 0.4 MV/cm.

Based on FIG. 14, the minimum value of the allowable barrier height is 0.7 eV when the upper limit of the allowable leakage current is 1 μA ($1 \times 10^{16}$ A).

Figure 15:
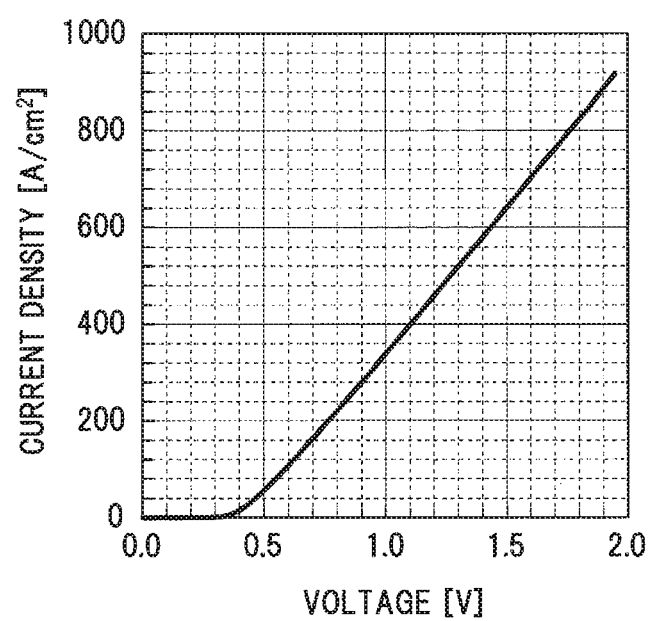
FIG. 15 shows forward characteristics of the trench MOS-type Schottky diode with a withstand voltage of 1200V when calculated using on-resistance and barrier height derived by simulation.

FIG. 15 shows forward characteristics of the trench MOS-type Schottky diode 1 with a withstand voltage of 1200V when calculated using on-resistance and barrier height described above. Based on FIG. 15, forward voltage when driving at, e.g., 200 A/cm² is 0.7 to 0.8V.

Table 3 below shows examples of structural parameters of the trench MOS-type Schottky diode 1 with a withstand voltage of 600V which were derived in the same manner based on the simulation results described above.

TABLE 3

| | |
|---|---|
| ½ width $W_m$ of mesa-shaped portion | 0.5 μm |
| ½+12width $W_t$ of trench 12 | 1 μm |
| Thickness $T_i$ of insulating film 15 | 50 nm |
| Thickness $T_e$ of second semiconductor layer 11 | 4.5 μm |
| Depth $D_t$ of trench 12 | 3 μm |
| Relative permittivity $\varepsilon_s$ of insulating film 15 | 22 ($HfO_2$) |
| Donor concentration $N_d'$ of first semiconductor layer 10 | Not less than $1.0 \times 10^{19}$ $cm^{-3}$ |
| Thickness $T_s$ of first semiconductor layer 10 | Not more than 100 μm |
| Donor concentration $N_d$ of second semiconductor layer 11 | $3.0 \times 10^{16}$ $cm^{-3}$ |

On-resistance of the second semiconductor layer 11 and that of the first semiconductor layer 10 were respectively 1.0 mΩcm² and 0.05 mΩcm². On-resistance of the second semiconductor layer 11 not having a trench structure, when calculated from resistivity of the second semiconductor layer 11, is 0.86 mΩcm², and 1.0 mΩcm² is the value derived on the assumption that the loss rises 1.2-fold due to the trench structure.

Figure 16:
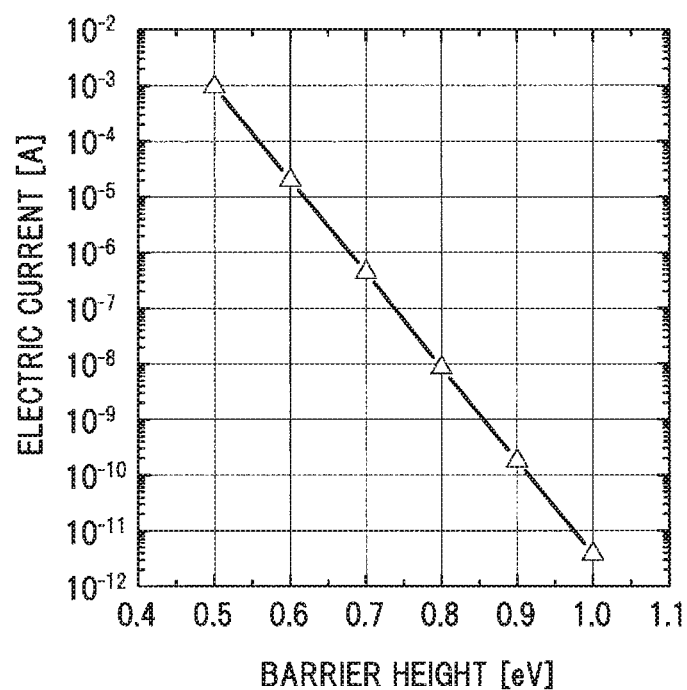
FIG. 16 shows a relation between reverse leakage current and barrier height at the interface between the anode electrode and the second semiconductor layer.

FIG. 16 shows a relation between reverse leakage current and the barrier height at the interface between the anode electrode 13 and the second semiconductor layer 11. The relation between the barrier height and the reverse leakage current shown in FIG. 16 was obtained from theoretical calculation, taking into account thermionic emission as well as mirror effect and on the assumption that the electrical field strength immediately under the anode electrode is 0.2 MV/cm.

Based on FIG. 16, the minimum value of the allowable barrier height is 0.7 eV when the upper limit of the allowable leakage current is 1 μA (1×10⁻⁶ A).

Figure 17:
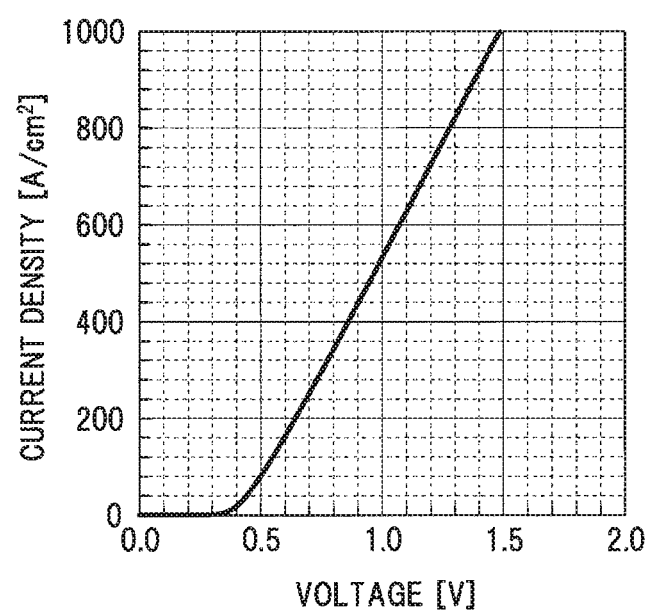
FIG. 17 shows forward characteristics of the trench MOS-type Schottky diode with a withstand voltage of 600V when calculated using on-resistance and barrier height derived by simulation.

FIG. 17 shows forward characteristics of the trench MOS-type Schottky diode 1 with a withstand voltage of 600V when calculated using on-resistance and barrier height described above. Based on FIG. 17, forward voltage when driving at, e.g., 200 A/cm² is 0.6 to 0.7V.

Although only the calculation results when withstand voltage is 1200V and 600V are shown in Example 1, elements having different withstand voltages can be also easily designed based on the calculation results in Example 1. For example, when designing an element with a withstand voltage 300V, the value of the electrical field strength in each part calculated to have withstand voltage of 1200V is reduced to a quarter, and structural parameters are changed accordingly.

When forming an element with a withstand voltage not less than 300V and not more than 600V, it is preferable to have the donor concentration $N_d$ of about not less than $3.0 \times 10^{16}$ cm⁻³ and not more than $3.0 \times 10^{17}$ cm⁻³ and the thickness $T_e$ of about not less than 2.0 μm and not more than 4.5 μm. Meanwhile, when forming an element with a withstand voltage not less than 1200V and not more than 1700V, it is preferable to have the donor concentration $N_d$ of about not less than $1.0 \times 10^{16}$ cm⁻³ and not more than $3.0 \times 10^{16}$ cm⁻³ and the thickness $T_e$ of about not less than 5.5 μm and not more than 9 μm. When forming an element with a withstand voltage not less than 1700V and not more than 10 kV, it is preferable to have the donor concentration $N_d$ of about not less than $1.0 \times 10^{15}$ cm⁻³ and not more than $1.0 \times 10^{16}$ cm⁻³ and the thickness $T_e$ of about not less than 9 μm and not more than 50 μm.

As a summary of the calculation results above, it is possible to form an element with a withstand voltage in a range of not less than 300V and not more than 10 kV by adjusting the donor concentration $N_d$ of the second semiconductor layer 11 in a range of about not less than $1.0 \times 10^{15}$ cm⁻³ and not more than $3.0 \times 10^{17}$ cm⁻³ and the thickness $T_e$ of the second semiconductor layer 11 in a range of about not less than 2.0 μm and not more than 50 μm.

Example 2

The effect of the insulation 22 of the trench MOS-type Schottky diode 2 in the second embodiment was investigated by simulation.

Figure 18A:
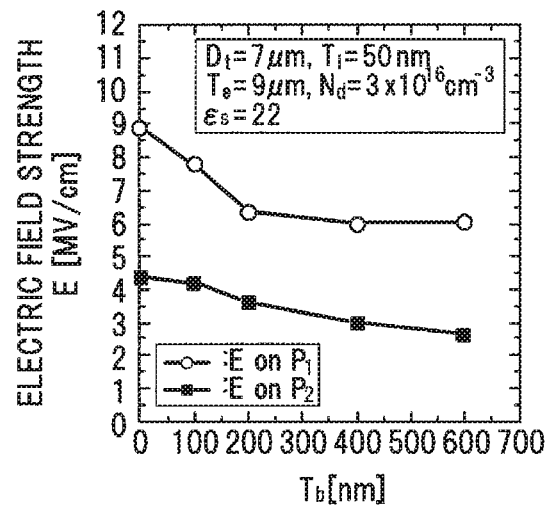
FIG. 18A shows a relation between thickness $T_b$ of an insulation immediately under the lowest portion of the insulating film and electrical field strength E at the points $P_1$ and $P_2$.
Figure 18B:
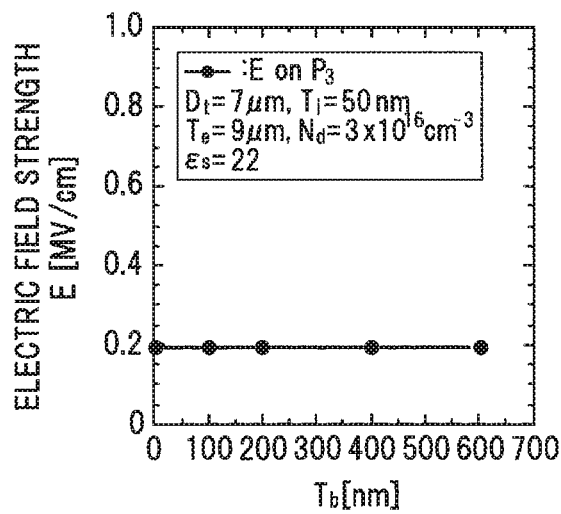
FIG. 18B shows a relation between thickness $T_b$ of the insulation immediately under the lowest portion of the insulating film and electrical field strength E at the point $P_3$.
Figure 18C:
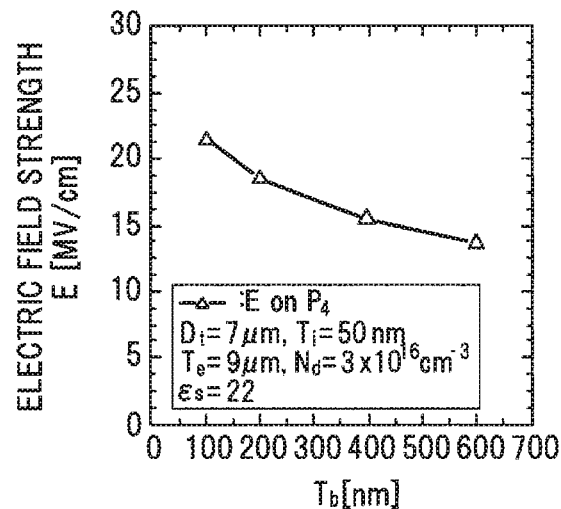
FIG. 18C shows a relation between thickness $T_b$ of the insulation immediately under the lowest portion of the insulating film and electrical field strength E at the point $P_4$.

FIGS. 18A, 18B and 18C show a relation between the thickness $T_b$ of the insulation 22 immediately under the lowest portion of the film 15 and the electrical field strength E at the points $P_1$, $P_2$, $P_3$ and $P_4$. The point $P_4$ here is a point with the highest electrical field strength E in the insulation 22. When the insulation 22 is provided, the point $P_1$ with the highest electrical field strength E in the second semiconductor layer 11 is located in the vicinity of a side surface of the insulation 22.

FIGS. 18A, 18B and 18C show that the maximum electric field strength in the second semiconductor layer 11, the maximum electric field strength in the insulating film 15 and the maximum electric field strength in the insulation 22 decrease as the thickness $T_b$ of the insulation 22 increases. Meanwhile, even when the thickness $T_b$ of the insulation 22 increases, the maximum electric field strength in a region of the second semiconductor layer 11 immediately under the anode electrode 13 hardly changes.

On the other hand, when the thickness $T_i$ of the insulating film 15 is increased, the maximum electric field strength in a region of the second semiconductor layer 11 immediately under the anode electrode 13 increases as shown in FIG. 8B. This means that, by providing the insulation 22 instead of increasing the thickness $T_i$ of the insulating film 15, it is possible to reduce the maximum electric field strength in the second semiconductor layer 11 without an increase in the maximum electric field strength in a region of the second semiconductor layer 11 immediately under the anode electrode 13.

Based on FIG. 18A, particularly the maximum electric field strength in the second semiconductor layer 11 is kept low by adjusting the thickness $T_b$ of the insulation 22 to about not less than 200 nm.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a trench MOS-type Schottky diode having a high withstand voltage and low loss.

REFERENCE SIGNS LIST 1, 2, 3 TRENCH MOS-TYPE SCHOTTKY DIODE
10 FIRST SEMICONDUCTOR LAYER
11 SECOND SEMICONDUCTOR LAYER
12, 21 TRENCH
13 ANODE ELECTRODE
14 CATHODE ELECTRODE
15 INSULATING FILM
16 TRENCH MOS GATE
22 INSULATION

The invention claimed is:
1. A trench MOS-type Schottky diode, comprising:
a first semiconductor layer comprising a $Ga_2O_3$-based single crystal;
a second semiconductor layer that is a layer laminated on the first semiconductor layer, and that comprises a $Ga_2O_3$-based single crystal and a trench opened on a surface thereof opposite to the first semiconductor layer,
an anode electrode formed on the surface of the second semiconductor layer opposite to the first semiconductor layer;

a cathode electrode formed on a surface of the first semiconductor layer opposite to the second semiconductor layer;

an insulating film covering the inner surface of the trench of the second semiconductor layer; and a trench MOS gate that is embedded in the trench of the second semiconductor layer so as to be covered with the insulating film and is directly in contact with the anode electrode.

2. The trench MOS-type Schottky diode according to claim 1, wherein a donor concentration in the second semiconductor layer is not less than $1.0\times10^{15}$ cm$^{-3}$ and not more than $3.0\times10^{17}$ cm$^{-3}$, and a thickness of the second semiconductor layer is not less than 2.0 μm and not more than 50 μm.

3. The trench MOS-type Schottky diode according to claim 2, wherein the donor concentration in the second semiconductor layer is not less than $3.0\times10^{16}$ cm$^{-3}$ and not more than $6.0\times10^{16}$ cm$^{-3}$, and the thickness of the second semiconductor layer is not less than 4.5 μm and not more than 9 μm.

4. The trench MOS-type Schottky diode according to claim 3, wherein the thickness of the second semiconductor layer is not less than 5.5 μm.

5. The trench MOS-type Schottky diode according to claim 1, wherein a lower surface of the insulating film is covered with an insulation having a lower permittivity than the insulating film.

6. The trench MOS-type Schottky diode according to claim 5, wherein a thickness of the insulation immediately under the lowest portion of the insulating film is not less than 200 nm.

7. The trench MOS-type Schottky diode according to claim 5, wherein the insulation is in contact with the first semiconductor layer.

8. The trench MOS-type Schottky diode according to claim 2, wherein a lower surface of the insulating film is covered with an insulation having a lower permittivity than the insulating film.

9. The trench MOS-type Schottky diode according to claim 3, wherein a lower surface of the insulating film is covered with an insulation having a lower permittivity than the insulating film.

10. The trench MOS-type Schottky diode according to claim 4, wherein a lower surface of the insulating film is covered with an insulation having a lower permittivity than the insulating film.

* * * * *